United States Patent [19]

Cernius et al.

[11] Patent Number: 4,470,022

[45] Date of Patent: Sep. 4, 1984

[54] PSEUDO ATMOSPHERIC NOISE GENERATOR HAVING VARIABLE AMPLITUDE PROBABILITY DISTRIBUTIONS AND DISCHARGE FINE STRUCTURE

[75] Inventors: Roger K. Cernius; Don M. French, both of El Cajon; Paul A. Singer, Santee; Donald J. Adrian, Leucadia; Donald I. Parsons, San Diego, all of Calif.

[73] Assignee: The United States of America as represented by the Secretary of the Navy, Washington, D.C.

[21] Appl. No.: 391,624

[22] Filed: Jun. 24, 1982

[51] Int. Cl.³ .............................................. H03B 29/00
[52] U.S. Cl. ........................................ 331/78; 364/717
[58] Field of Search ............................ 331/78; 364/717

[56] References Cited

U.S. PATENT DOCUMENTS

| | | | |
|---|---|---|---|
| 2,773,185 | 12/1956 | Fulton et al. | 250/36 |
| 3,614,399 | 10/1971 | Linz | 235/152 |
| 3,617,925 | 11/1971 | Bensema et al. | 331/78 |
| 4,173,000 | 10/1979 | Singer et al. | 331/78 |
| 4,375,620 | 3/1983 | Singer et al. | 331/78 |

Primary Examiner—Siegfried H. Grimm
Assistant Examiner—Robert Pascal
Attorney, Agent, or Firm—Robert F. Beers; Ervin F. Johnston; Thomas Glenn Keough

[57] ABSTRACT

A reliable, repeatable and stable VLF/LF atmospheric noise generator is capable of producing noise with known or given amplitude probability distributions and temporal characteristics such as pulse duration, pulse spacing, pulses per unit time and the discharge fine structure between pulses. A pseudo random noise carrier signal is multiplied in a plurality of digital-to-analog converters with the discharge envelopes created in a plurality of interconnected discharge envelope generators. The discharges are representative of cloud-to-ground discharges, intercloud discharges, the discharge rate, strokes per discharge and the discharge fine structure. All of the discharges are readily modifiable by suitably reprogramming operatively coupled memories and microprocessors in accordance with selected loading instructions.

8 Claims, 5 Drawing Figures

PSEUDO ATMOSPHERIC NOISE GENERATOR HAVING VARIABLE AMPLITUDE PROBABILITY DISTRIBUTIONS AND DISCHARGE FINE STRUCTURE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Atmospheric noise at the VLF/LF ranges is a highly impulsive and non-stationary phenomena over any time interval greater than ten to fifteen minutes. Because of the excellent propagation of energy in this frequency range, atmospheric noise in this range, commonly produced by lightning discharges, is characterized by high dynamic range impulses on the order of 60 db or more over that of receiver internally-generated-thermal noise.

The atmospheric noise, in general, is described as being a low amplitude Gaussian-type background noise in combination with that of the impulsive noise. Because of the nonstationary characteristics of the VLF/LF atmospheric noise, attempts have been made in the past to simulate its characteristics in such a manner that communication systems could be tested and evaluated with an acceptable degree of repeatability.

One such attempt manifested itself in the design of the "Simulated VLF/LF Noise Generator" of Paul Singer and Roger Cernius in U.S. Pat. No. 4,173,000. This design could be configured to produce a typical amplitude probability distribution of atmospheric noise within an expected dynamic range. As noteworthy as this design is, the control of the temporal characteristics of the impulse noise was preset and was not controllable independent of the amplitude probability distribution. A sophisticated noise analyzer for calibration, self-testing and setting up of signal-to-noise ratios for modem testing was required. A single amplitude probability distribution could be produced at a time for a given frequency from the programmable probability gate settings. Changes in the amplitude probability distributions require extensive hardware changes to the headers in the programmable probability and the set-up procedure involved an iterative trial and error process.

Thus, there is a continuing need in the state-of-the-art for a VLF/LF atmospheric noise generator being capable of generating a variety of amplitude probability distributions and discharge fine structure between discharges without requiring complicated and time consuming structural modifications to simulate atmospheric noise conditions that appear in different locations during changing seasons and for different portions of the VLF/LF electromagnetic spectrum.

SUMMARY OF THE INVENTION

The present invention is directed to providing an apparatus for producing VLF/LF atmospheric noise signals having a given amplitude probability distribution and temporal pulse characteristics for the frequency range of 10 to 100 kHz. A number of independent band-limited pseudo random noise carrier signals are generated and a plurality of discharge envelope signals representative of cloud-to-ground discharges, intra-cloud discharges, the discharge rate, strokes per discharge and the frequency dependent discharge fine structure between discharges are multiplied in a plurality of digital-to-analog converters. Changing the discharge envelope signals by means of a microprocessor and memory in each discharge envelope generator allows the selective modification of the average discharge rate, the average number of impulses per discharge, the average amplitude of strokes in the discharge and the discharge fine structure so that the atmospheric noise in the VLF/LF range can be simulated for different areas, seasons, frequencies and times of day without requiring hardware modifications.

A prime object of the invention is to provide an improved atmospheric noise simulator.

Another object is to provide an atmospheric noise simulator allowing the generation of atmospheric noise for any site on the surface of the earth for any season, time of day or frequency of interest.

Another object is to provide an atmospheric noise generator that creates realistic characteristics such as pulse spacing, pulses per unit time and the discharge fine structure between discharges and preserves correlations in the fine structure by simulating the pulse inbetween return strokes or major cloud-to-cloud discharges.

A further object is to provide for a stemmatic set-up procedure involving the use of an off-line program rather than a time consuming trial and error procedure.

Still another object is to provide an apparatus employing the application of easily modifiable stored discharge characteristics that are determined after localized field measurements are made.

Yet a further object of the invention is to provide an improved atmospheric noise generator having the capability to be modified to use additional atmospheric information as it becomes available without costly hardware modifications or redesign.

Still another object of the invention is to provide an improved noise simulator that reduces the complexity of external self-monitoring and rarification measurement devices.

These and other objects of the invention will become more readily apparent from the ensuing specification when taken together with the drawings.

DESCRIPTION OF THE PREFERRED EMBODIMENT

Figure 1:
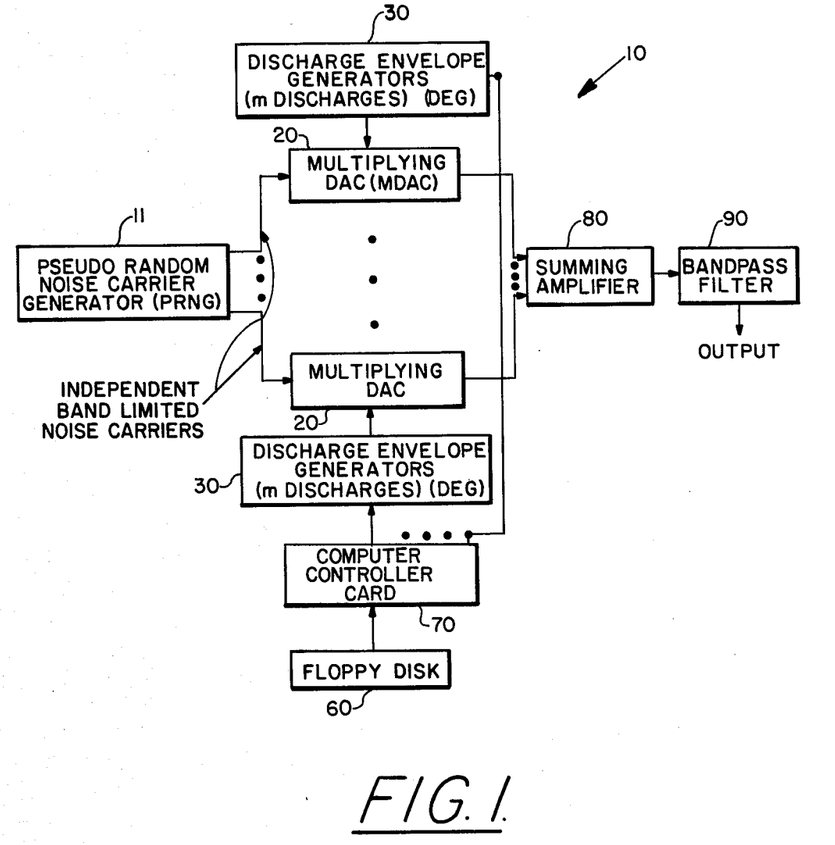
FIG. 1 is a simplified noise simulator functional block diagram of the atmospheric noise generator.

Referring now to FIG. 1 of the drawings a simplified block diagram of the pseudo atmospheric noise generator 10 provides a simulated portrayal of atmospheric noise in the VLF/LF range. A pseudo random noise carrier generator 11 provides a number of independent band limited noise carriers by means of the following circuitry. Within the generator, a base band pseudo noise waveform is generated by a feedback shift back register circuit which is clocked at a rate higher than the desired noise bandwidth and taps from this shift register circuit are fed into exclusive OR gates in combination with a square wave that is close to but not within the desired operating frequency range. This effectively heterodynes the signal to a desired operating frequency band and provides a signal with twice the base bandwidth centered on the fundamental of the square wave plus spurious components which are reduced by an output bandpass filter. As mentioned, the desired noise bandwidth is either above or below the fundamental frequency of the square wave carrier.

Each output of noise carrier generator 11 is made statistically independent from the other by using taps in the feedback shift register so that the tapped signals are separated one from the other by a magnitude fraction of one over the value of the base bandwidth. The statistical independence has been found desirable so that the envelope modulated carriers discussed below will combine independently in a summing amplifier in a predictable manner. Twelve taps were provided in a representative embodiment of this noise generator to provide for an accurate simulation of the atmospheric disturbances in a number of regions at different times and during predictable atmospheric variations.

The carrier generator can be fabricated in accordance with well established teachings in the art for the generation for pseudo random signals. Typically an approach may be followed which is discussed by G. David Fourney, Jr. in the June 1970 issue of IEEE Spectrum in his article entitled "Coding and Its Application in Space Communications." This article presents a number of encoder-decoder systems for modeling a white-Gaussian-noise channel. The shift register sequence generators and feedback circuits discussed on pages 51 et seq apprise a reader of well known techniques for fabricating an appropriate pseudo random noise carrier with appropriate taps such as that called for in the present invention.

The individual outputs of the pseudo random noise carrier signals are received by a number of multiplying digital-to-analog converters 20 each of which are coupled to a separate discharge envelope generator 30. Details of these circuits will be discussed at length below, however let is suffice to say at this time that they enable the modulation of a number of discrete pseudo random noise signals in accordance with instructions coming from a floppy disc storage 60 media that have been fed through a computer controller card 70 and eventually to the discharge envelope generators and multiplying digital-to-analog converters.

Figure 2:
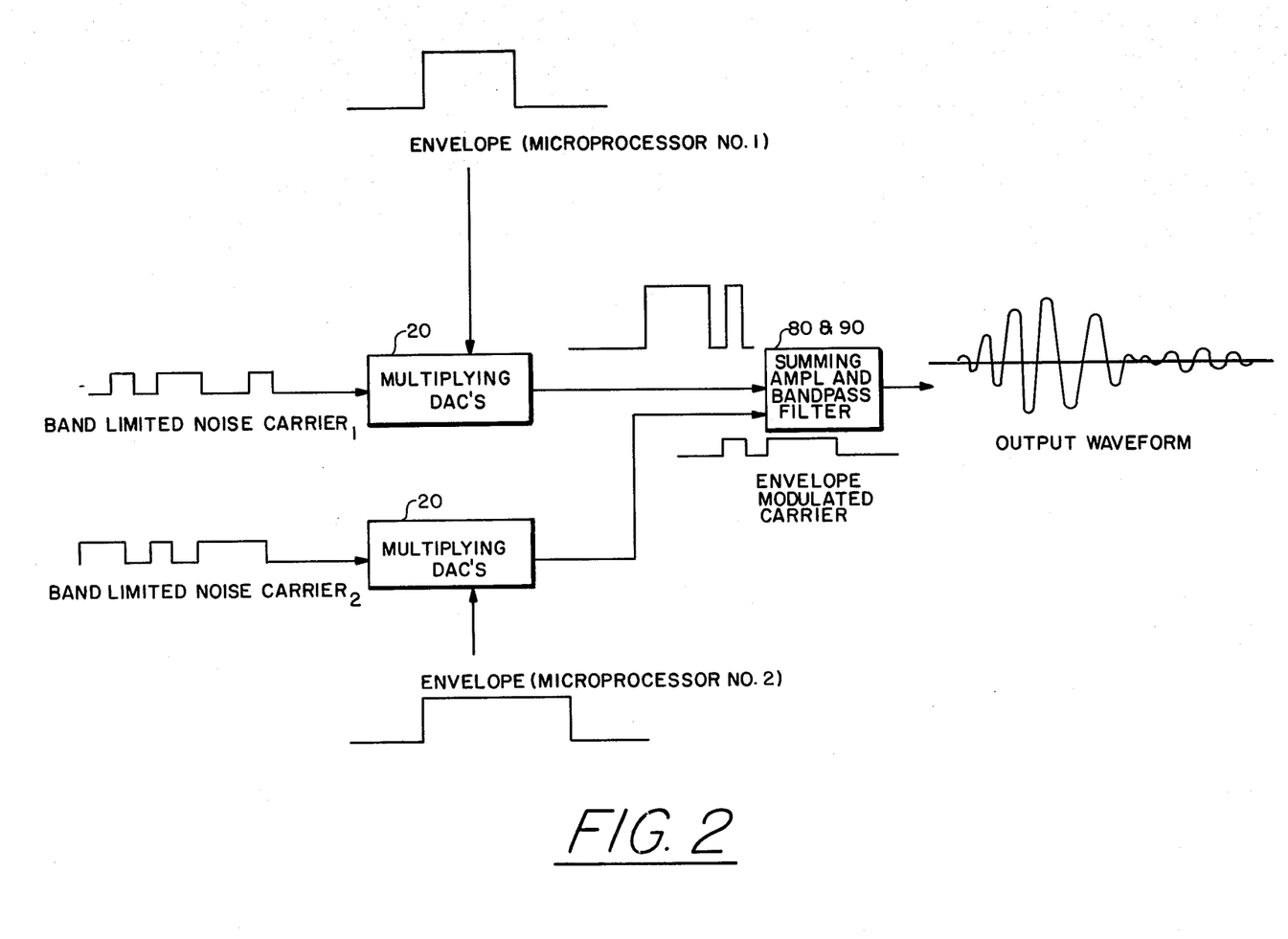
FIG. 2 depicts typical waveforms within a portion of the simulator.

The discretely modulated pseudo random noise carriers then are fed to a summing amplifier 80 and bandpass filter 90 to provide smoothing and to give waveforms typical of band-limited atmospheric noise. Noting for example the representation in FIG. 2, a pair of DAC's are shown each receiving a discrete band-limited noise carrier which is modulated by an envelope from their interconnected discharge envelope generator. The composite signals each at their own controlled level, are fed to and passed through a summing amplifier and bandpass filter 80 and 90.

The embodiment of the pseudo atmospheric noise generator depicted in FIG. 1 allows for up to four simultaneous discharges per each discharge envelope generator 30. A preferred embodiment incorporated twelve discharge generators operating in a parallel configuration with each generator multiplying digital-to-analog converter 20 connected to summing amplifier 80. Each group of discharges within each discharge envelope generator is under the control of a microprocessor 31, see FIGS. 3 and 4, and provides modulating pulses for the pseudo random noise carrier signals over a range of up to 96 decibels (16 bits). The generation of discharge envelopes rather than the discrete discharge waveforms reduces the required data rate to a value where a commerical microprocessor can accomplish the generation of the noise process.

Before the structure of the invention is described in detail, a familiarity with the off-line programs contained in each of the discharge envelope generators is advisable. The program computes if a discharge distribution represents a ground stroke distribution or a intra-cloud distribution, the average discharge rate of the distribution, the average number of impulses per discharge, the amplitude of bursts (mean amplitude of strokes in the bursts) and the relative ratio between major discharge events in the distribution to frequency dependent fine structures between major discharges received from major storm areas.

Each of the program perform several steps. Those being data bases in the program provide the number of ground and intra-cloud discharges by geographical area. The number of discharges is modified according to season and time of day to define a source function for VLF/LF atmospheric noise. An existing propagation code is incorporated into the program to compute the mean amplitudes of discharges from major source areas as received at a selected site. The program sets out a composite discharge rate and associated LK pulse (intradischarge) amplitude (frequency dependent fine structure) for each of the twelve discharge envelope generators for each discharge type (ground or cloud) and the amplitude range of each of the multiplying digital-to-analog converters. This set of amplitude ranges together with their average probability of occurrence which provides the average rate tables of values are uniformly sampled for discharge generators contained within the noise simulator. These tables are loaded off-line into the microprocessors 31 and memories 32 within each of the discharge envelope generators in the noise simulator before initiation of atmospheric noise generation.

To restate, the off-line program loaded into each of microprocessors 31 and memories 32 in each of the discharge envelope generators will provide table values for each discharge generator (to be described below) giving amplitude distributions for return strokes (cloud-to-ground discharges), iK pulses (intracloud discharges) and LK pulses (the distribution fine structure between return and iK discharges). The LK pulse amplitude distributions are a fixed (frequency dependent) db below the return of iK pulse distributions. Each of the off-line programs also provides the average discharge rate and average number of strokes or iK pulses per discharge. Other lightning discharge parameters are also used by the noise generator and are provided by fixed table values set forth below. These parameters include the occurrence of discharges being proportional to a time interval distribution, return stroke proportional to the number distribution and to the time interval distribution, the iK pulse being proportional to the number distribution and to the time interval distribution and the LK pulse being proportional to the number distribution and the time interval distribution.

Each discharge envelope generator group requires an independent pseudo random noise carrier input to its associated multiplying digital-to-analog converter as previously described. A preferred embodiment of the pseudo atmospheric noise genertor will contain approximately twelve discharge generator groups.

Figure 3:
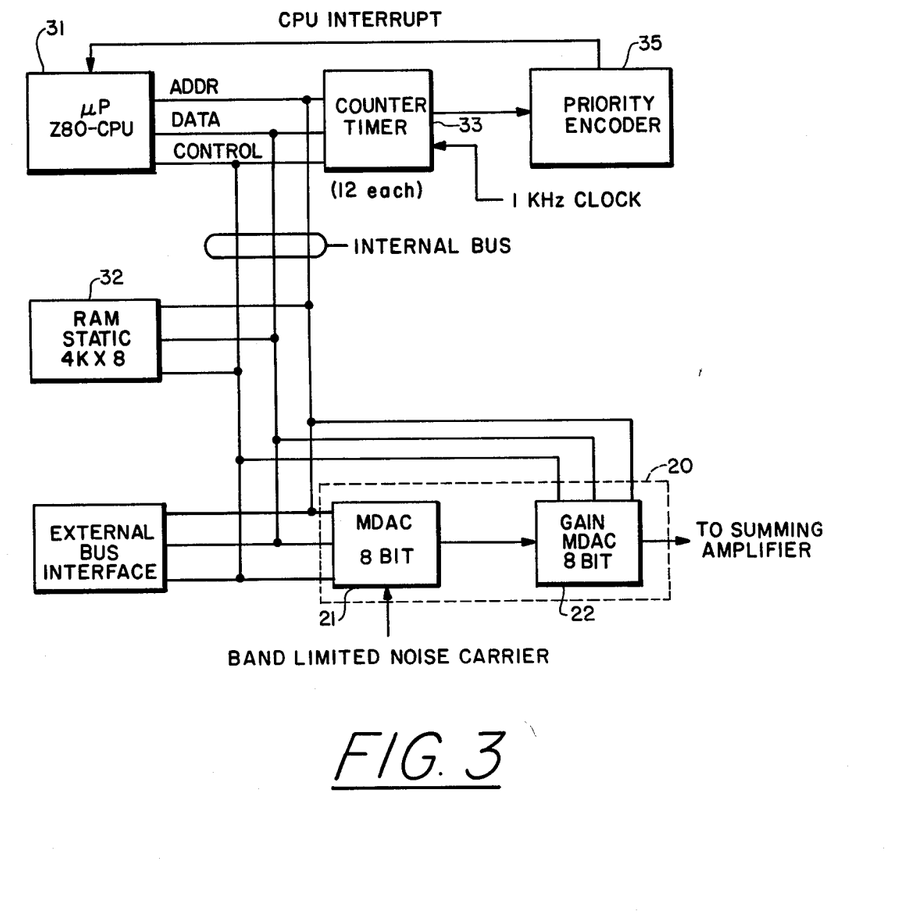
FIG. 3 depicts a discharge group block diagram wherein each group is capable of generating up to four simultaneous discharges.

Looking to FIG. 3 each of the groups will be substantially identical and will contain an 8-bit microprocessor 31, a random access memory 32, the interconnected multiplying digital-to-analog converters 20, counter timers 33, and associated controller interface circuitry. The program for each of the twelve microprocessors 31 is loaded through a computer controller card 70 that receives any of forty-eight different discharge distributions and information pertaining to each distribution described above in the off-line program description from floppy disc 60.

In a representative embodiment, the microprocessors are all type Z80 from ZILOG Corp. of Cupertino, Calif. Eight Intel P2141 static RAMs were suitably connected to function as the memories 32 while AD7533's from Analog Devices of Norwood, Mass. were suitably connected as the MDAC's 21 and 22 of each multiplying digital-to-analog converter 20. The controller selected for the computer controller card 70 is an MSC 8009 that is suitably connected to all the microprocessors. Each microprocessor executes identical programs and is responsible for receiving timer interrupts, generating random numbers, performing table look-ups, and outputting suitable numbers to the inerconnected multiplying digital-to-analog converters.

The random numbers generated in each of the microprocesors are in response to the program loaded by the controller and are used as addresses for table look-up in the tables set forth below. The addresses have a uniform distribution density in the present version and the addresses are independent variables. However, the numbers stored in memories 32 have a different distribution.

The discharge, amplitude and rate values in the tables are different for each of the four distributions contained in each discharge generator and are dependent on the off-line program load prior to noise simulation. The values for the discharge time intervals and number of events per discharge burst are given in the tables 1 through 5 below and are loaded by the computer controller card 70 using values specified by the floppy disc drive unit. Each discharge group, see FIG. 3, generates four simultaneous discharge distributions and the controller loads the program into each RAM memory 32, loads tables into each RAM 32, and controls the microprocessor with respect to addresses designating bus request, reset, go etc. The microprocessor or center processing unit 31 generates a pseudo random number address with the required statistics.

The maximum pulse spacing and minimum resolutions typically are K stroke, spacing approximately equals 20 milliseconds, with 8-bits representing seventy-eight microsecond resolution; return stroke, spacing of approximately one-hundred milliseconds, with 8-bits representing three-hundred and ninety microsecond resolution; and discharge rate, spacing equalling approximately up to forty seconds, with one millisecond clock resolution.

Figure 4:
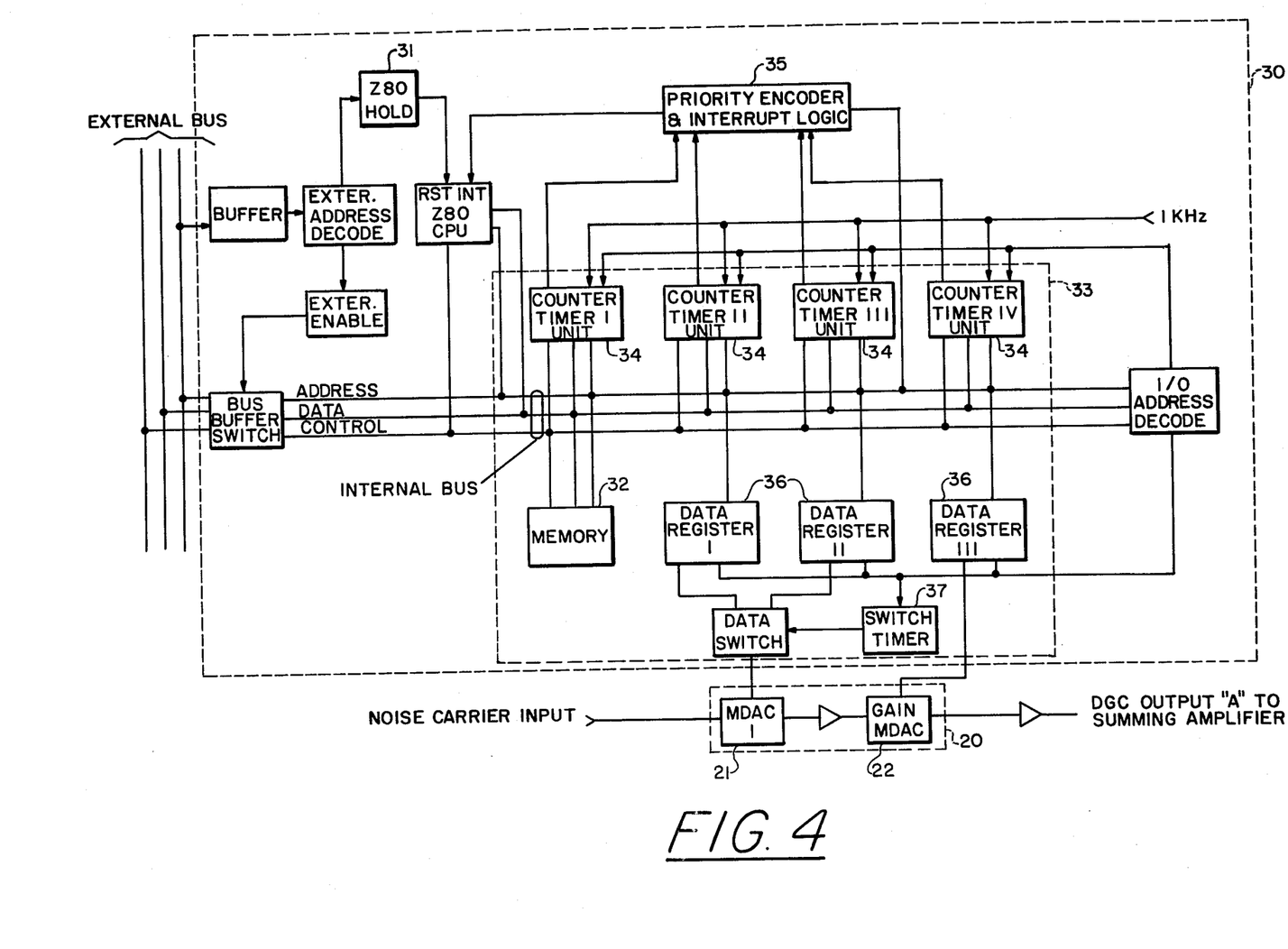
FIG. 4 depicts the discharge generator card block diagram (one-half of a board only is shown, the other half is identical).
Figure 5:
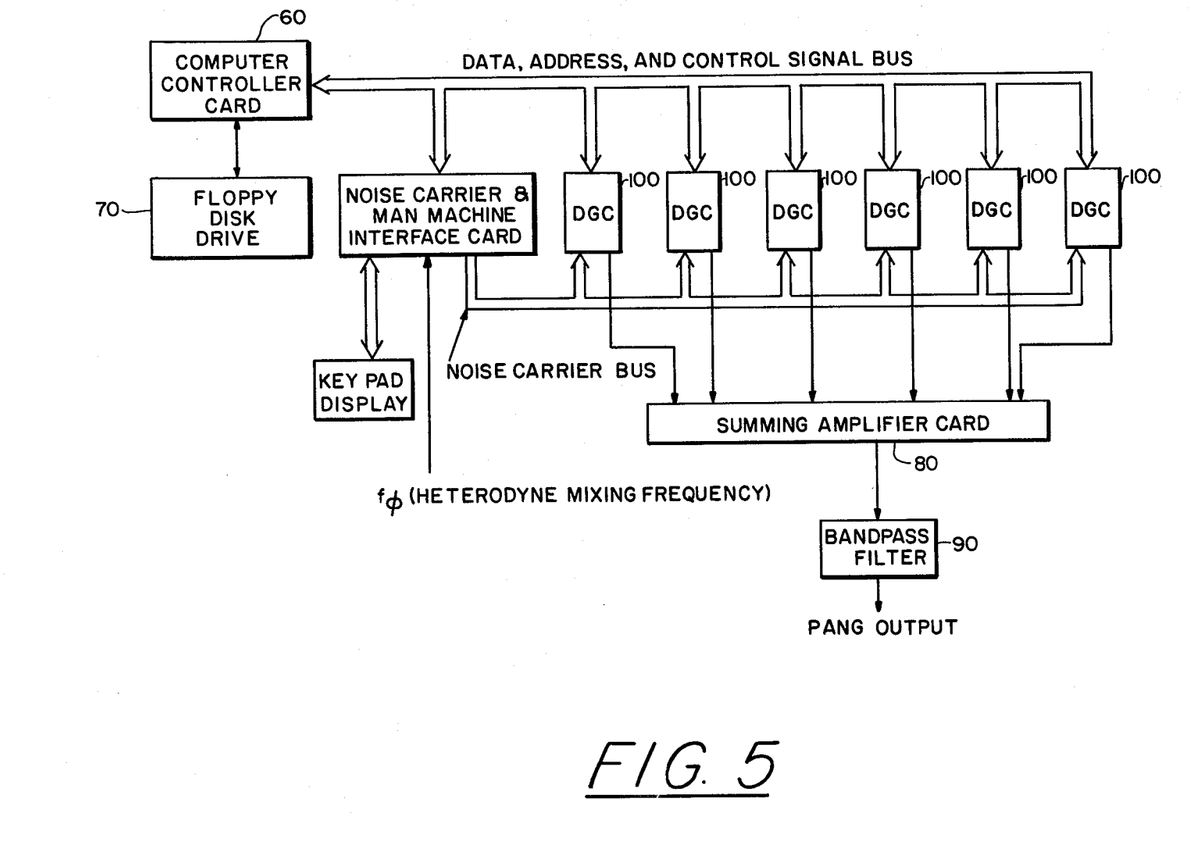
FIG. 5 depicts a more complete representative depiction of the pseudo atmospheric noise generator system block diagram.

A more detailed schematic of the present discharge generator is shown in FIG. 4. It should be pointed out that two such discharge envelope generators are mounted on each discharge generator card in packaging. In this regard, the computer controller summing amplifier, the numbers of discharge generators, interface, etc. are conveniently packaged on appropriately named cards, see FIG. 5, in the finalized design. This approach assures higher reliability to enable trouble shooting and quick repair in the unlikey event of malfunction.

The program for each envelope generator is identical, only the table values differ between the discharge envelope generators 30. Referring once again to FIG. 4, in each discharge envelope generator the counter time 33 contains four counter time units 34 (one counter unit per discharge distribution) which are in turn composed of three appropriately connected counters which are preset from values from the tables. The counters in the timer units are Intel #P8253's that count down at a 1-kHz rate. When a counter reaches 0, an interrupt is generated and sent to a priority encoder and interrupt logic 35 which determines the source of the interrupt and reloads the counters with the next count down interval from table lockup. Depending upon the counter which was interrupted, a set of values is loaded into data registers 36 from tables in RAM memories 32 which are under control from microprocessors 31. Suitable data registers for use in the present application are Model 74LS273's by Texas Instruments.

After loading from the microprocessor, the data registers contain a pulse value and a background value. The pulse value is output for a fixed period controlled by an interconnected switch timer 37 followed by the background value of data register 36 II. Data register 36 III contains a preset gain factor.

There are three types of events which occur for a ground discharge each of which is initiated by an interrupt from the timers. These three events are the start of a discharge, the start of a stroke and the start of a LK stroke. Each Counter Timer Unit I, II, III, and IV, one for each discharge distribution, contains three individual counter timers which will be called A, B, and C. The discharge event having an average compute time of no more than two-hundred fifty microseconds involves the reloading of discharge timer unit A, the selecting of the number of strokes for the discharge, the loading of stroke timer B, the outputting of the stroke amplitude to MDAC 21, the loading of the LK pulse timer unit C, and the selecting of the number of LK pulses for this stroke. The stroke event has an average compute time of less than 150 microseconds and decrements the strokes remaining if one or more are yet to be done, reloads the stroke timer 3A, provides an output stroke amplitude to MDAC 21, loads the stroke pulse timer 3B, and stores the number of strokes remaining for this discharge. The LK pulse event has an average compute time of less than 100 microseconds and decrements the LK pulses remaining, if one or more are yet to be done, reloads the LK pulse timer 3C, outputs the LK pulse amplitude to MDAC 21, and the number of LK pulses remaining between the stroke for the discharge. For an intracloud discharge the events are essentially identical with the iK pulses in place of return strokes.

It must be emphasized that past simulators have not concerned themselves with the generation of the frequency dependent fine grain discharge structure which occurs between major impulse discharges. The values for the discharge fine structure (LK), return strokes, and iK pulses are given in the following tables 1 through 5. The magnitude of these values are fixed but are readily changeable when new information regarding a lightning discharge is obtained.

TABLE 1.

Time Interval Distribution for Return Strokes

| Entry No. | Interval (ms) | Entry No. | Interval (ms) |
|---|---|---|---|
| 1 | 5 | 33 | 50 |
| 2 | 9 | 34 | 51 |
| 3 | 10 | 35 | 52 |
| 4 | 12 | 36 | 53 |
| 5 | 14 | 37 | 55 |
| 6 | 16 | 38 | 56 |
| 7 | 18 | 39 | 57 |
| 8 | 20 | 40 | 59 |
| 9 | 22 | 41 | 60 |
| 10 | 24 | 42 | 62 |
| 11 | 26 | 43 | 63 |
| 12 | 27 | 44 | 64 |
| 13 | 28 | 45 | 66 |
| 14 | 29 | 46 | 68 |
| 15 | 31 | 47 | 70 |
| 16 | 32 | 48 | 73 |
| 17 | 33 | 49 | 75 |
| 18 | 34 | 50 | 77 |
| 19 | 35 | 51 | 80 |
| 20 | 36 | 52 | 83 |
| 21 | 37 | 53 | 86 |
| 22 | 38 | 54 | 90 |
| 23 | 39 | 55 | 93 |
| 24 | 40 | 56 | 96 |
| 25 | 41 | 57 | 100 |
| 26 | 42 | 58 | 105 |
| 27 | 43 | 59 | 110 |
| 28 | 44 | 60 | 120 |
| 29 | 45 | 61 | 130 |
| 30 | 46 | 62 | 140 |
| 31 | 48 | 63 | 150 |
| 32 | 49 | 64 | 180 |

TABLE 2.

Time Interval Distribution for K pulses

| Entry No. | Interval (ms) LK | Interval (ms) iK | Entry No. | Interval (ms) LK | Interval (ms) iK |
|---|---|---|---|---|---|
| 1 | 4 | 8 | 33 | 19 | 37 |
| 2 | 5 | 11 | 34 | 19 | 38 |
| 3 | 6 | 13 | 35 | 20 | 39 |
| 4 | 7 | 14 | 36 | 20 | 40 |
| 5 | 8 | 16 | 37 | 21 | 41 |
| 6 | 8 | 17 | 38 | 21 | 42 |
| 7 | 9 | 18 | 39 | 22 | 43 |
| 8 | 9 | 19 | 40 | 22 | 44 |
| 9 | 10 | 20 | 41 | 22 | 45 |
| 10 | 10 | 21 | 42 | 23 | 46 |
| 11 | 11 | 22 | 43 | 23 | 47 |
| 12 | 11 | 23 | 44 | 24 | 48 |
| 13 | 12 | 24 | 45 | 24 | 49 |
| 14 | 12 | 24 | 46 | 25 | 50 |
| 15 | 13 | 25 | 47 | 26 | 52 |
| 16 | 13 | 26 | 48 | 27 | 54 |
| 17 | 13 | 27 | 49 | 28 | 56 |
| 18 | 14 | 27 | 50 | 29 | 58 |
| 19 | 14 | 28 | 51 | 30 | 60 |
| 20 | 14 | 29 | 52 | 31 | 62 |
| 21 | 15 | 29 | 53 | 32 | 64 |
| 22 | 15 | 30 | 54 | 34 | 67 |
| 23 | 15 | 30 | 55 | 35 | 70 |
| 24 | 16 | 31 | 56 | 36 | 72 |
| 25 | 16 | 32 | 57 | 38 | 75 |
| 26 | 16 | 33 | 58 | 40 | 80 |
| 27 | 17 | 34 | 59 | 42 | 85 |
| 28 | 17 | 34 | 60 | 45 | 90 |
| 29 | 17 | 35 | 61 | 48 | 97 |
| 30 | 18 | 35 | 62 | 53 | 105 |
| 31 | 18 | 36 | 63 | 63 | 126 |
| 32 | 18 | 36 | 64 | 67 | 134 |

TABLE 3.

Number Distribution for Return Strokes

| Entry No. | Number of Return Strokes Per Discharge | | | |
|---|---|---|---|---|
| | $N_{ave}<2.5$ | $2.5 \leq N_{ave}<3.5$ | $3.5 \leq N_{ave}<4.5$ | $4.5 \leq N_{ave}$ |
| 1 | 1 | 1 | 1 | 1 |
| 2 | 1 | 1 | 1 | 1 |
| 3 | 1 | 1 | 1 | 1 |
| 4 | 1 | 1 | 1 | 2 |
| 5 | 1 | 1 | 1 | 2 |
| 6 | 1 | 1 | 2 | 2 |
| 7 | 1 | 1 | 2 | 2 |
| 8 | 1 | 1 | 2 | 2 |
| 9 | 1 | 1 | 2 | 3 |
| 10 | 1 | 1 | 2 | 3 |
| 11 | 1 | 2 | 2 | 3 |
| 12 | 1 | 2 | 2 | 3 |
| 13 | 1 | 2 | 3 | 3 |
| 14 | 1 | 2 | 3 | 3 |
| 15 | 1 | 2 | 3 | 3 |
| 16 | 1 | 2 | 3 | 4 |
| 17 | 1 | 2 | 3 | 4 |
| 18 | 1 | 2 | 3 | 4 |
| 19 | 2 | 2 | 3 | 4 |
| 20 | 2 | 3 | 4 | 4 |
| 21 | 2 | 3 | 4 | 5 |
| 22 | 2 | 3 | 4 | 5 |
| 23 | 2 | 3 | 4 | 5 |
| 24 | 2 | 3 | 4 | 5 |
| 25 | 2 | 4 | 5 | 6 |
| 26 | 2 | 4 | 5 | 6 |
| 27 | 2 | 4 | 5 | 7 |
| 28 | 2 | 5 | 6 | 8 |
| 29 | 4 | 6 | 8 | 10 |
| 30 | 5 | 8 | 10 | 13 |
| 31 | 7 | 10 | 13 | 16 |
| 32 | 8 | 12 | 16 | 20 |

TABLE 4.

Number Distribution for LK Pulses

| Entry No. | LK Pulses After R Strokes | LK Pulses After iK pulses |
|---|---|---|
| 1 | 1 | 0 |
| 2 | 2 | 1 |
| 3 | 2 | 1 |
| 4 | 2 | 1 |
| 5 | 2 | 1 |
| 6 | 3 | 2 |
| 7 | 3 | 2 |
| 8 | 3 | 2 |
| 9 | 3 | 2 |
| 10 | 3 | 2 |
| 11 | 3 | 2 |
| 12 | 4 | 3 |
| 13 | 4 | 3 |
| 14 | 4 | 3 |
| 15 | 4 | 3 |
| 16 | 5 | 4 |

TABLE 5.

Number Distribution for iK Pulses

| Entry No. | Number of iK Pulses per Discharge | | | | |
|---|---|---|---|---|---|
| | $5.5 \leq N_{ave}<8.5$ | $8.5 \leq N_{ave}<11.5$ | $11.5 \leq N_{ave}<14.5$ | $14.5 \leq N_{ave}<17.5$ | $17.5 \leq N_{ave}$ |
| 1 | 1 | 1 | 3 | 3 | 3 |
| 2 | 2 | 2 | 4 | 4 | 5 |

TABLE 5.-continued

Number Distribution for iK Pulses
Number of iK Pulses per Discharge

| Entry No. | 5.5≦N$_{ave}$<8.5 | 8.5≦N$_{ave}$<11.5 | 11.5≦N$_{ave}$<14.5 | 14.5≦N$_{ave}$<17.5 | 17.5≦N$_{ave}$ |
|---|---|---|---|---|---|
| 3 | 2 | 3 | 5 | 5 | 7 |
| 4 | 3 | 4 | 6 | 6 | 8 |
| 5 | 3 | 4 | 6 | 7 | 9 |
| 6 | 3 | 4 | 6 | 7 | 10 |
| 7 | 3 | 4 | 7 | 8 | 10 |
| 8 | 3 | 5 | 7 | 8 | 11 |
| 9 | 4 | 5 | 7 | 9 | 11 |
| 10 | 4 | 6 | 8 | 9 | 12 |
| 11 | 4 | 6 | 8 | 10 | 13 |
| 12 | 4 | 6 | 8 | 10 | 13 |
| 13 | 4 | 6 | 9 | 11 | 14 |
| 14 | 4 | 7 | 9 | 11 | 14 |
| 15 | 5 | 7 | 9 | 11 | 15 |
| 16 | 5 | 7 | 10 | 12 | 15 |
| 17 | 5 | 7 | 10 | 12 | 16 |
| 18 | 6 | 8 | 11 | 13 | 16 |
| 19 | 6 | 8 | 11 | 14 | 17 |
| 20 | 6 | 9 | 11 | 15 | 17 |
| 21 | 7 | 9 | 12 | 16 | 18 |
| 22 | 7 | 10 | 13 | 17 | 19 |
| 23 | 7 | 10 | 13 | 18 | 20 |
| 24 | 7 | 11 | 14 | 19 | 22 |
| 25 | 8 | 12 | 15 | 20 | 24 |
| 26 | 9 | 13 | 17 | 21 | 26 |
| 27 | 10 | 14 | 19 | 22 | 28 |
| 28 | 11 | 16 | 20 | 26 | 32 |
| 29 | 14 | 20 | 26 | 32 | 38 |
| 30 | 18 | 26 | 33 | 40 | 46 |
| 31 | 22 | 32 | 39 | 46 | 49 |
| 32 | 27 | 38 | 40 | 50 | 50 |

NOTE:
For N$_{ave}$<5.5 use Table 3

The selection of values are determined by two events. First, for each discharge envelope generator memory the number distribution for return strokes and iK pulses as set out in tables 3 and 5 is determined by the off-line program determination of the average number of pulses per discharge and is inserted prior to an atmospheric noise simulation. For ground discharges the values of tables 1, 2 (LK), 3, and 4 are loaded into memory prior to atmospheric noise simulation. For intracloud discharges tables 2 (iK), 2 (LK), 4 and 5 are loaded into memory. Second actual values selected from each envelope discharge generator's RAM 32 are determined by uniformly distributed random numbers derived in each microprocesor 31.

The time interval distributions for discharges are generally independent one from the other (except at high rates). This is in contrast with the distribution of the return strokes within a discharge. The probability, density function for the intervals between discharge (low rate Poisson process) is given by $$p(t) = v \exp(-vt)$$

where v=average rate and 1/v=average interval=T$_0$. The probability that an interval is larger than t is $$\exp(-vt)$$

and the cumulative distribution is $$1 - \exp(-vt)$$

A 64 element table when uniformly sampled is considered to have a probability of 1.56% of addressing any element. The normalized interval (interval/average interval) for entry #n may be expressed as $$T/T_0 = \text{Ln}(1 - (n/64)) \quad n = 1 \text{ to } 63$$
$$= 4.85 \quad n = 64$$

The above values could be converted to integer values by multiplying by 64 or larger numbers. The value of v=1/T$_0$ for each discharge distribution is determined by the off-line program entered into the microprocessor 31 and memory 32 and is used to compute the time interval table values. The time interval tables are loaded prior to noise generation.

The computer controller card 70 is, as mentioned above, an MSC 8009 which performs two primary functions. These are the communication with the auxiliary computer or recorder, and in this case designated as a floppy disc 70 and the loading of the memories of the discharge generator cards. The pseudo atmospheric noise generator is capable of providing the proper simulation signal only after the computer controller card has performed the communication and loading functions.

The serial communication uses a UART so that the processor merely reads data from the auxiliary computer or floppy disc 70, saves it, and determines the type of data and where to put it. The floppy disc has been found to be a suitable source for this purpose.

Loading the data into a particular discharge generator card's memory 32 calls for the controllers requesting the data address and control signal bus from a microprocessor 31. After the microprocessor has released its bus the controller is free to load the memory of the discharge generator with pre-computed data representative, for example, of changing storm conditions, area, etc. After the data has been loaded, the controller resets the microprocessor and determines when the discharge generator cards should start. A master GO signal is necessary to ensure reproducibility. A signal interface between the computer controller card and the discharge generator cards on which the discharge envelope generators are located is consistent and appropriate for sound engineering design among the units identified above.

Obviously, many other modifications and variations of the present invention are possible in the light of the above teachings. It is therefore to be understood that within the scope of the appended claims the invention may be practiced otherwise than as specifically described.

What is claimed is:

1. An apparatus for producing VLF/LF atmospheric noise signals having a given amplitude probability distribution and temporal pulse characteristics comprising:

means for generating a psuedo-random noise carrier signal;

means for generating a discharge envelope representative of cloud-to-ground discharges, intra-cloud discharges, the discharge rate, strokes per discharge, and discharge fine distribution;

means for initiating the discharge envelope generating means being operatively coupled thereto and having means for reprogrammably providing signals representative of the average discharge rate, the average number of impulses per discharge, the average amplitude of strokes in the discharge and the discharge fine structure;

means coupled to the pseudo-random noise carrier generating means and the discharge envelope generating meand for multiplying their signals to provide at least a part of an envelope modulated carrier signal; and means connected to the multiplying means for receiving the envelope modulated carrier signal.

2. An apparatus according to claim 1 in which the pseudo-random noise carrier generating means is provided with a number of taps, the discharge envelope generating means includes a plurality of discharge envelope generators, the initiating means constitutes a plurality of reprogrammable providing means each operatively coupled with a separate discharge envelope generator and the multiplying means includes a plurality of digital-to-analog multipliers each coupled to a separate tap and a separate discharge envelope generator.

3. An apparatus according to claim 2 further including:

means coupled to the discharge envelope generating means through the intitiating means for providing reprogramming of average rate signals in the reprogrammable providing means.

4. An apparatus according to claim 3 in which the receiving means is a summing means coupled to all the digital-to-analog multipliers to provide a composite VLF/LF atmospheric noise signal.

5. An apparatus according to claim 4 further including:

means coupled to the summing means for shaping the composite signal to be typical of a band-limited atmospheric noise signal.

6. An apparatus according to claim 5 in which each reprogrammable providing means includes a random access memory coupled to a microprocessor both of which are programmed to provide a selected atmospheric noise pattern to assure the signals representative of the proper statistical number of pulses within the discharge and the proper statistical number of smaller fine grain impulses within the discharge.

7. An apparatus according to claim 6 in which each discharge envelope generator includes a plurality of counters all coupled to a discrete random access memory and a microprocessor and to a plurality of data registers to assure the signals representative of the proper statistical discharge rate, the proper statistical time between impulses per discharge and the proper statistical time between the smaller fine grain impulses within the discharge.

8. An apparatus according to claim 7 in which each discharge envelope generator includes means for generating the discharge fine structure between discharges that is frequency dependent across the VLF/LF spectrum.

* * * * *